United States Patent [19]

Queyssac

[11] Patent Number: 5,426,059
[45] Date of Patent: Jun. 20, 1995

[54] METHOD OF MAKING VERTICALLY STACKED BIPOLAR SEMICONDUCTOR STRUCTURE

[76] Inventor: Daniel G. Queyssac, 9316 E. Aster Dr., Scottsdale, Ariz. 85260

[21] Appl. No.: 249,757

[22] Filed: May 26, 1994

[51] Int. Cl.⁶ .................. H01L 49/00; H01L 21/265; H01L 21/302
[52] U.S. Cl. ......................... 437/6; 437/20; 437/27; 437/31; 437/61
[58] Field of Search ................. 437/6, 20, 27, 31, 32

[56] References Cited

U.S. PATENT DOCUMENTS

| | | | |
|---|---|---|---|
| 4,169,000 | 9/1979 | Riseman | 148/187 |
| 4,274,909 | 6/1981 | Venkataraman et al. | 437/31 |
| 4,278,476 | 7/1981 | Bartko et al. | 437/20 |
| 4,649,411 | 3/1987 | Birrittella | 357/36 |
| 4,698,129 | 10/1987 | Puretz et al. | 437/20 |
| 4,829,018 | 5/1989 | Wahlstrom | 437/51 |
| 4,876,212 | 10/1989 | Koury . | |
| 4,889,832 | 12/1989 | Chatterjee | 437/203 |
| 4,916,083 | 4/1990 | Monkowski et al. | 437/31 |
| 5,053,346 | 10/1991 | Yuan et al. | 437/22 |
| 5,055,418 | 10/1991 | Vora | 437/31 |
| 5,091,321 | 2/1992 | Huie et al. | 437/27 |
| 5,118,636 | 6/1992 | Hosaka | 437/35 |
| 5,122,848 | 6/1992 | Lee et al. | 357/23.6 |
| 5,124,764 | 6/1992 | Mori | 357/23.4 |
| 5,234,535 | 8/1993 | Beyer et al. | 156/630 |

FOREIGN PATENT DOCUMENTS 89-309174/42  3/1987  Japan .

*Primary Examiner*—Olik Chaudhuri
*Assistant Examiner*—Brian K. Dutton
*Attorney, Agent, or Firm*—Gregory M. Howison

[57] ABSTRACT

A vertical bipolar structure is fabricated utilizing high energy implant techniques. An epitaxial substrate (10) is first formed of the first conductivity material. A deep implant is formed in the substrate to a first level to form a layer (12) of the first conductivity type. Thereafter, a second implant at a slightly lower energy level is made to provide a second conductivity type layer (14) on top of the layer (12). A third implant of a lower energy of the first conductivity type material is then made to form an even shallower depth layer (16). This is followed by a final lower energy implant to form a second conductivity type layer (18) above the layer (16). This therefore results in a vertical stack of alternating conductivity type layers. The substrate is then patterned and etched to form vertical structures (26) which are disposed in an array with trenches aligned along the columns and the rows. An insulating material is then disposed in the trenches and a portion of the insulating layer proximate to the sidewalls of one of the rows of trenches etched downward to expose the second layer proximate to the deepest layer and then a layer of polysilicon (36) disposed and etched to form buried contacts (32) to the layer (14).

7 Claims, 5 Drawing Sheets

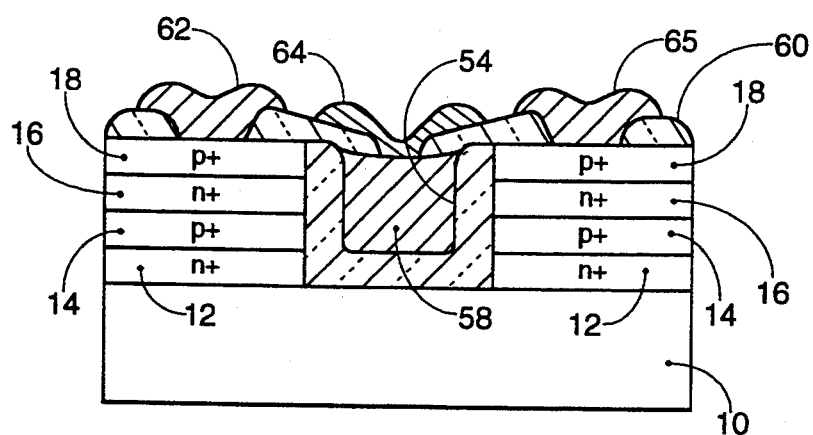
FIG. 9
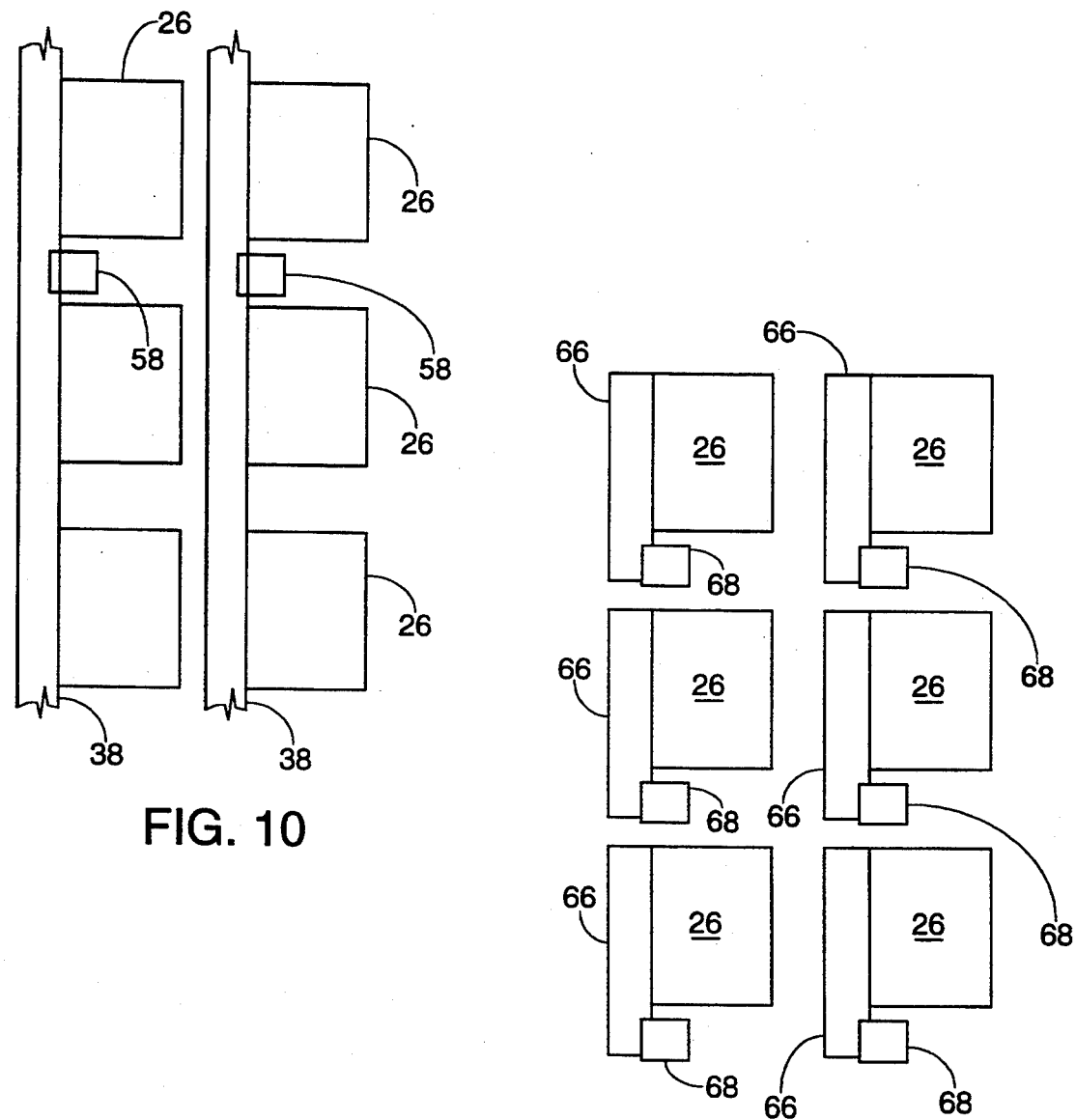
FIG. 10
FIG. 11

5,426,059

METHOD OF MAKING VERTICALLY STACKED BIPOLAR SEMICONDUCTOR STRUCTURE

TECHNICAL FIELD OF THE INVENTION

The present invention pertains in general to semiconductor structures, and more particularly to a semiconductor structure wherein vertical structures are formed in a plurality of vertical structures of alternating conductivity types.

BACKGROUND OF THE INVENTION

Conventional semiconductor manufacturing processes typically utilize a planar process wherein semiconductor structures such as transistors, capacitors, diodes, etc., were formed in a horizontal manner on the face of the semiconductor substrate. As the density of semiconductor structures increase, the semiconductor manufacturers merely "scale down" the structures by using advanced lithography techniques. However, as line widths have decreased, available processing techniques have proved to be a limiting factor, especially when the line widths fall to sub-micron dimensions. Thus, the need for increased density, especially in the memory area, still existed.

To increase the density of an integrated circuit beyond the limits of the available photolithography techniques, vertically integrated structures have been utilized. These structures typically utilize one of two techniques, a first technique for building the structure upward from the face of the semiconductor substrate, and a second technique for building the structure vertically down into the substrate. In the first technique, various epitaxial layers are grown on top of a base substrate with structures fabricated within the intermediate epitaxial layers. The disadvantage to this is that it is difficult to form an epitaxial layer at a later time while still preserving the underlying structure. In the vertical structure formed downward into the substrate, trench etching techniques have been utilized wherein a trench is etched into the substrate and various structures formed on the sidewalls of the trench. This is typically utilized for dynamic random access memory cells wherein the capacitor can be formed along the trench. Further, the vertical structures have been realized wherein the transistor is formed on the sidewall of the trench. However, these have typically used amorphous polysilicon which provides rather poor leakage characteristics for a transistor.

SUMMARY OF THE INVENTION

The present invention disclosed and claimed herein comprises a method and apparatus for forming a vertical multi-layered semiconductor structure. A semiconductor substrate of the first conductivity is provided and then a first layer of semiconductor material of the first conductivity type formed by implanting first conductivity type impurities into the substrate to a first depth. A second layer of second conductivity type material opposite to the first conductivity type material is formed by implanting the impurities of the second conductivity type into the substrate to a second depth shallower than the first depth which also forms a semiconductor junction between the first and second layers. A third layer of first conductivity type material is formed by implanting first conductivity type impurities into the substrate to a third depth shallower than the third depth, having a semiconductor junction between the first, second and third layers. A trench is then formed around a portion of the first, second and third layer structure to form an isolated multi-layered semiconductor structure. A buried contact layer is then formed within the trench proximate to and contacting the exposed sidewall of the second layer of the isolated multi-layered semiconductor structure and isolated from the substrate underlying the first layer. A contact is then formed between the buried contact layer and a point proximate the surface of the substrate.

In another aspect of the present invention, the trenches are formed as an array of rows and columns of trenches such that a plurality of isolated semiconductor structures are formed that are arranged in rows and columns separated by the rows and columns of trenches. In one embodiment, the buried contact layer is comprised of a continuous layer disposed within each of the rows of trenches and contacting only one of the rows of isolated semiconductor structures and the second layer therein. In another embodiment, a separate buried contact is provided for each of the isolated semiconductor structures proximate to the second layer therein.

In yet another embodiment of the present invention, the trenches are formed by first patterning the substrate to define the trenches and then performing a trench etch thereon down to a point deeper than the semiconductor junction between the first and second layers. The buried contact layer is then formed by first filling the trenches with an insulating material and etching the insulating material to form a contact trench. A contact trench is formed on one side of the semiconductor trench to expose the sides of the isolated semiconductor structures on that side of the semiconductor trench. The contact trench is etched to a depth that is above the bottom of the semiconductor trench and above the semiconductor junction between the first and second layers. The contact trench is then filled with a layer of polycrystalline silicon which is thereafter etched down to a level that is below the semiconductor junction between the second and third layers. Then an insulating material is deposited to fill the space etched in the polycrystalline silicon up to the surface of the wafer so as to provide isolation.

BRIEF DESCRIPTION OF THE DRAWINGS

For a more complete understanding of the present invention and the advantages thereof, reference is now made to the following description taken in conjunction with the accompanying Drawings in which:

FIG. 9 illustrates a cross-sectional view of the contact areas within the trenches;

FIG. 10 illustrates a top view of the substrate illustrating the plug that slightly overlaps and contacts the buried contact layer;

FIG. 11 illustrates an alternate embodiment of the present invention, wherein the buried contact layer is patterned and etched within the trench between rows of the multi-layered semiconductor structures;

DETAILED DESCRIPTION OF THE INVENTION

Figure 1A:
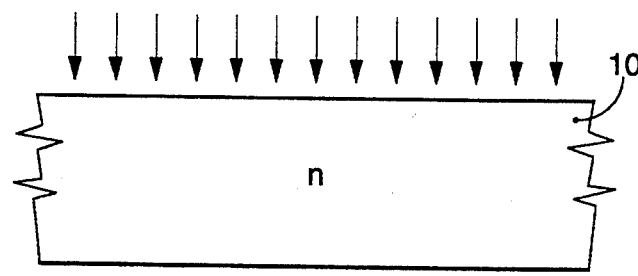
FIGS. 1a–1d illustrate the various process steps for forming the implanted and alternating semiconductor layers within the face of the semiconductor substrate.
Figure 1B:
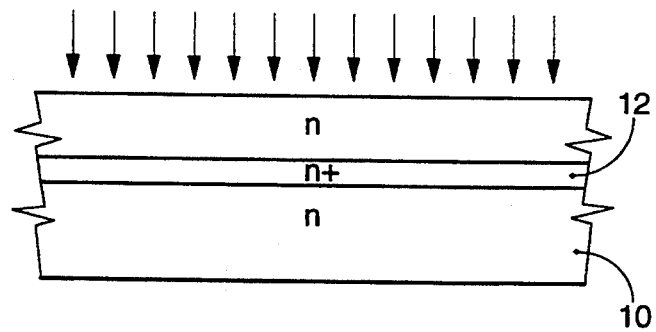
Figure 1C:
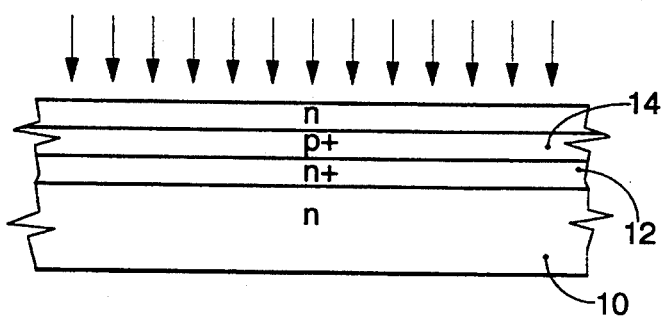
Figure 1D:
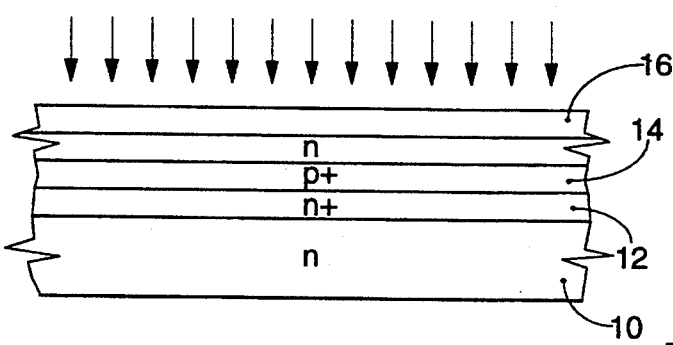

Referring now to FIGS. 1a–1d, there are illustrated the steps for forming multi-layered semiconductor structure. A semiconductor substrate 10 is provided which is fabricated from an N-type conductivity material which is doped to an appropriate concentration for an epitaxial substrate layer. A first implantation step is illustrated in FIG. 1a, wherein N-type material is implanted into the upper surface of the substrate 10. This is achieved utilizing either phosphorous or arsenic with a high energy ion implanter. This step typically utilizes an energy of 3.18 megavolts to drive the N-type impurities to a depth of 3.86 $\mu$m to a thickness of 0.18 $\mu$m at one sigma. This will result in the formation of an N+ layer 12 within the substrate 10. This is illustrated in FIG. 1b. Also in FIG. 1b is illustrated a second implant step wherein P-type doping material is implanted into the substrate 10. This typically utilizes Boron. This will be implanted at a lower energy level than that of the N-type impurities that form the layer 12, resulting in the formation of a P+ layer 14 in the N-type substrate 10, as illustrated in FIG. 1c. This layer 14 has a thickness of approximately 0.14 $\mu$m at one sigma. The Boron implant provides a penetration depth of 1.76 $\mu$m per megavolt as compared to the Phosphorous implant which provides a penetration depth of approximately 1.1 $\mu$m per megavolt. The implant for the P+ layer 14 is set such that the depth of P-layer 14 will be at 2.5 $\mu$m with a thickness of 1 $\mu$m at one sigma. Also illustrated in FIG. 1c is a third implant step utilizing an N-type doping material with the implant parameters set to establish a 1 $\mu$m thickness layer at an average depth of 1.5 $\mu$m to provide an N+ layer 16, as illustrated in FIG. 1d. This is then followed by a fourth implant of P-type doping material with the implant parameters set to establish a 1 $\mu$m thick layer at an average depth of 0.5 $\mu$m. This forth implant step is utilized when a silicon controlled rectifier (SCR) is fabricated. If not fabricated, only three implant steps would be required and, thus, only three layers. This will result in the fabrication of a P+ layer 18. It should be understood that the various implant energy levels and doping materials can be changed depending upon the depth of the level and performance characteristics required from the material at each level.

After each implant has been performed, it is necessary to follow each implant with an anneal step wherein possible damage done to the silicon lattice due to the implants is repaired. This anneal typically allows for recrystallization of silicon, this being a conventional step. This is performed at a temperature of approximately 1100°–1200° C. During this process, the implanted impurities, which are concentrated in relatively tight bands at the initial implant depths, will diffuse outward providing a more even distribution of the impurities across the various layers metallurgical junction between the various layers 12–18. Additionally, the thicknesses of the layers depend upon the amount of impurities that are implanted, this being a function of the length of time of the implant. When subjected to the anneal step, these impurities will diffuse and move the metallurgical junction away from the center of the implant.

Figure 2:
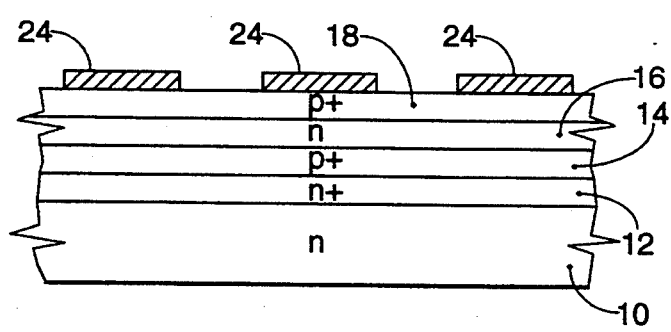
FIG. 2 illustrates a patterning step for the array of semiconductor structure.
Figure 3:
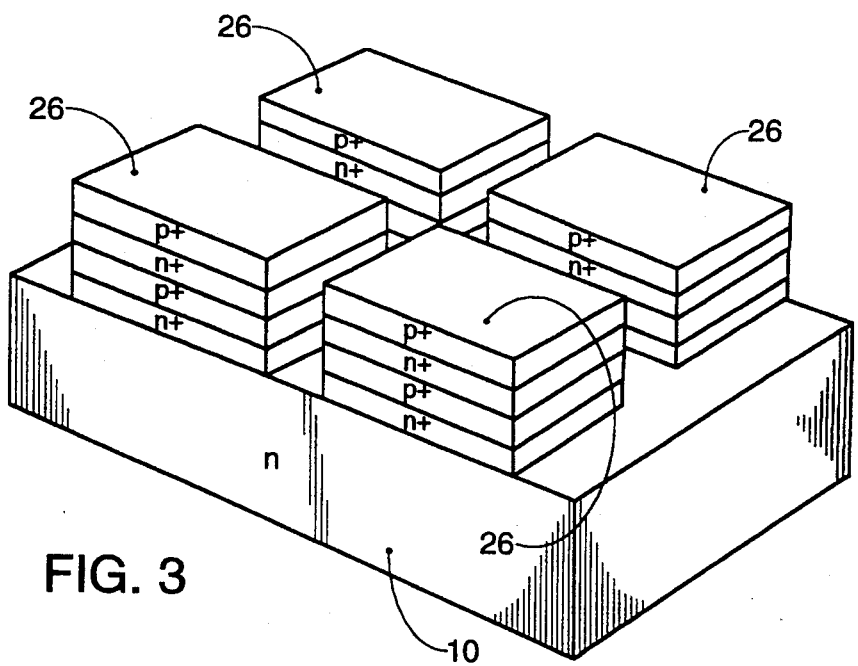
FIG. 3 illustrates a perspective view of the semiconductor structures after etching.

Referring now to FIG. 2, there is illustrated a cross-sectional diagram of the next process step wherein a layer of photoresist is spun on the substrate with conventional techniques and then patterned to form the resist patterns 24. These resist patterns 24 define an array of semiconductor structures. Thereafter, the substrate 10 with the resist layers 24 associated therewith is subjected to a "trench" etch process, which is conventional. This trench etch is an anisotropic etch which etches downward at a higher rate than in the lateral direction. This results in substantially vertical walls formed proximate to the edges of the photoresist pattern 24. However, there is a slight slant imparted to the wall for cleaning purposes. This results in a structure illustrated in FIG. 3, wherein four multi-layered semiconductor structures are illustrated, separated by the trenches.

Figure 4:
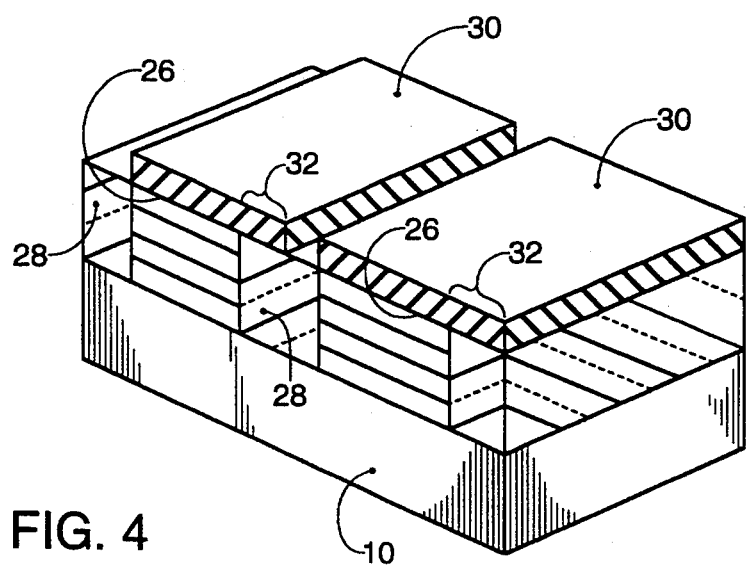
FIG. 4 illustrates a perspective view of the first contact patterning step.

Referring now to FIG. 4, there is illustrated the next step in this processing. After the formation of the trenches and the definition of the various multi-layered structures, a layer of insulator is formed on the substrate, and is referred to as "spun-on glass" (SOG). This is a process whereby an insulator layer is deposited on the substrate such that the low areas have a much thicker level of insulator disposed therein and the raised surfaces have a very thin layer. The substrate can then be subjected to a downward etch which will remove the thin layers while allowing the thick layers within the recessed areas to remain. This essentially "fills" the trenches. This results in a layer of SOG 28 being formed between all of the multi-layered structures 26. Thereafter, a layer of photoresist is deposited onto the substrate and then patterned to cover all of the multi-layered structures 26 such that the portion of the layer 28 between the structures 26 in a given row are also covered by the photoresist layer, with the SOG layer between structures 26 in a given column substantially exposed. However, the photoresist layer pattern 30 for each row, although the covering of the structures 26 associated with that row, extend out a predetermined distance on one side of the structure 26 into the trench between columns with a portion 32. This overlaps only a portion of the trench between columns.

Figure 5:
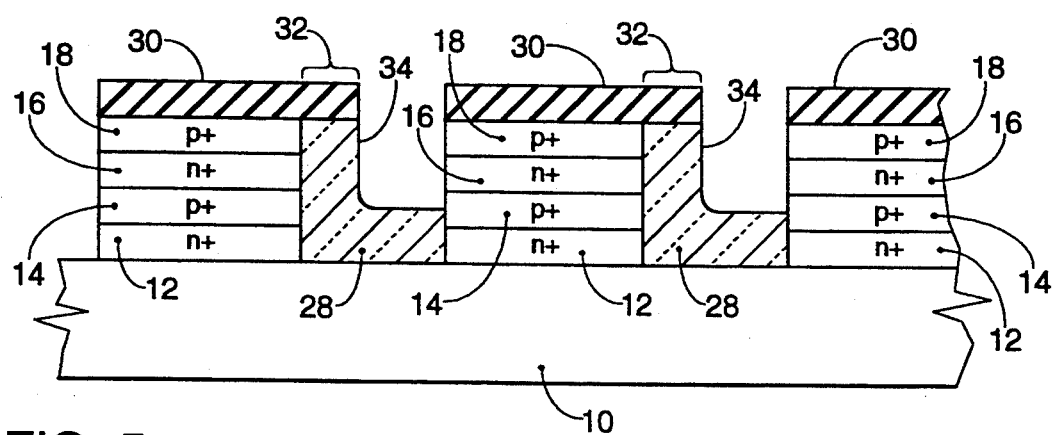
FIG. 5 illustrates a cross-sectional view after etching the insulating material down to a predetermined level.

Referring now to FIG. 5, there is illustrated the next step in the process, wherein the substrate 10 is subjected to an anisotropic etch for a predetermined period of time. This results in a trench 34 being formed within the exposed portion of the SOG layer 28 within the trench between the columns of structures 26 and extending downward to expose the sidewall of the layers 16 and a portion of the sidewall of layers 14 such that the sidewall of the layers 12 are not exposed. This is the first step in forming a buried contact.

Figure 6:
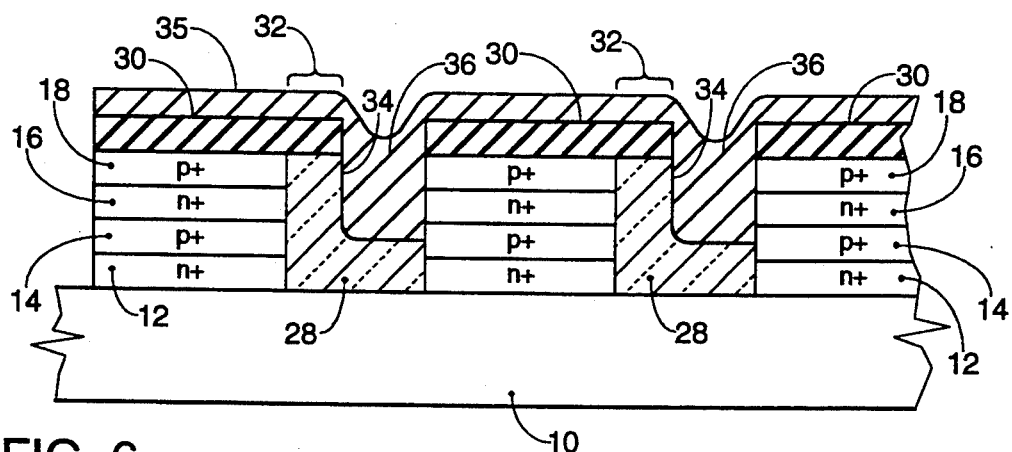
FIG. 6 illustrates a cross-sectional view of the semiconductor substrate after either a silicon is formed in the etched trench of FIG. 5.
Figure 7:
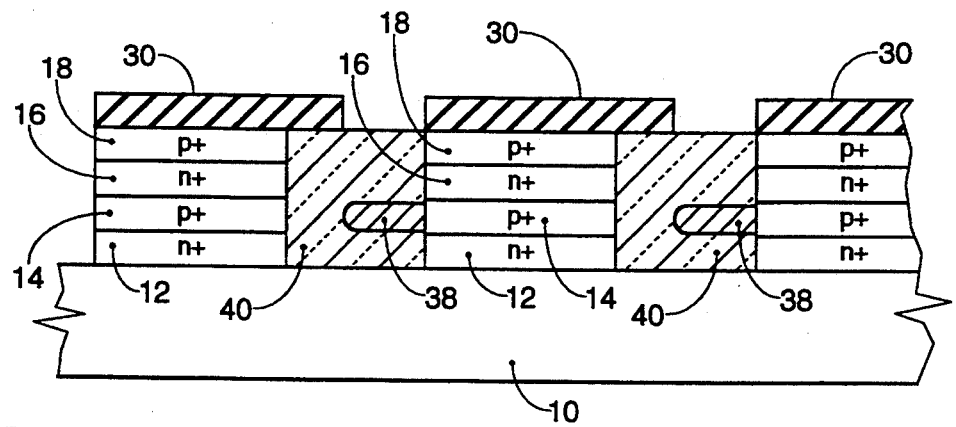
FIG. 7 illustrates a cross-sectional view after the silicon in the trench has been etched and back-filled with glass.

Referring now to FIG. 6, there is illustrated the next step in the process whereby a conformal layer 35 of doped (p+) polycrystalline silicon (poly) is deposited over the structure and within each of the trenches 34 to essentially fill the trenches 34. This results in a "plug" of poly 36 being formed within the trenches 34. Although not illustrated, this could be preceded by a barrier layer of, for example, TiNi. This etching step is followed by an etching step wherein the layer 35 and plug 36 are etched downward to form a buried contact 38. Typically, the buried contact 38 is etched such that the upper surface thereof is lower than the boundary between the two layers 14 and 16, and therefore contacts only the sidewall of the layer 14. After the step of etching the plug 36 to form the buried contact 38, a doping step can be performed wherein P-type impurities are implanted into the buried contact layer 38 to increase the conductivity thereof. Additionally, a silicide layer can be formed on the surface of the layer 38 to increase the conductivity thereof, these all being conventional techniques. Thereafter, an additional SOG step is performed to again fill the trench 34, resulting in a layer 40 of SOG completely surrounding the buried contact layer 38.

Figure 8:
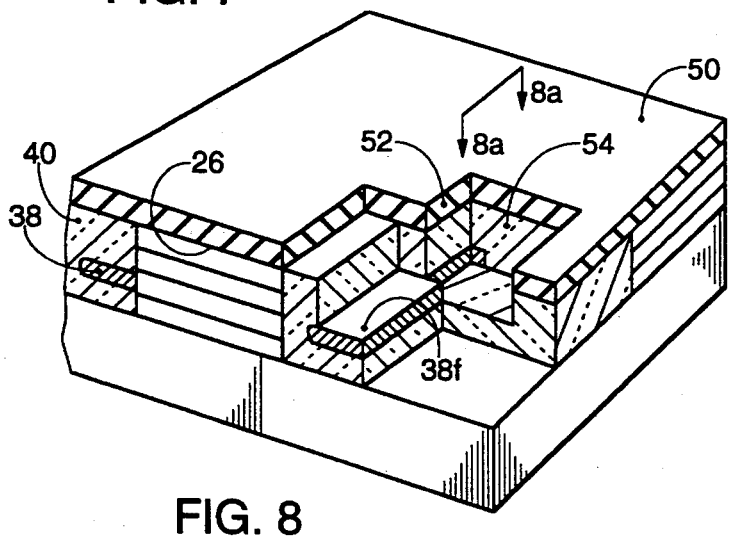
FIG. 8 illustrates a cut away perspective view for the step of forming a contact.
Figure 8A:
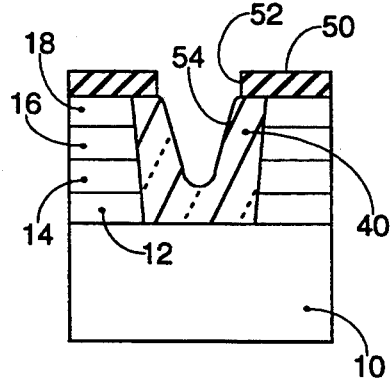
FIG. 8a illustrates a cross-sectional detail of the structure of FIG. 8.

Referring now to FIG. 8, there is illustrated the next process step wherein an opening is made within the SOG layer 40 between rows to provide contact to the buried contact 38. A layer of photoresist 50 is deposited onto the structure and patterned to provide an opening 52 within the SOG layer 40. The SOG layer 40 between rows of the structure 26 is then etched to from a contact trench 54 which exposes a portion of the buried contact layer 38 on the upper surface thereof. The detail of this is illustrated in FIG. 8a. These contact openings slightly overlap the buried contact layer 38, such that the openings extend into the trenches between columns.

Referring now to FIG. 9, there is illustrated a final processing step wherein the trench 54 is filled with a polysilicon filler or plug 58 by depositing polysilicon over the substrate 10 and then the substrate 10 covered with a conformal layer of oxide 60. Vias are then formed through the oxide layer 60 to contact the various underlying structures. A layer of metal is then deposited onto the substrate and then patterned to form contacts 62, 64 and 65. The contacts illustrated in FIG. 9 are formed to either the structures 26 (contact 62 and 65) or to the plug 58 (contact 64). This is a conventional process.

Referring now to FIG. 10, there is illustrated a top view of the substrate 10 illustrating the plug 58 that slightly overlaps and contacts the buried contact layer 38 and extends inward to the column between the multi-layered semiconductor structures 26. It can be seen that the plugs 58 are only disposed at select locations along the length of the continuous buried contact 38. This is for the purpose of, first, providing a contact to the buried contact layer 38 from the upper surface of the substrate and, second, disposing the contacts 58 at select locations along the length of the continuous buried contact layer 38 such that the higher resistance that is inherent to the polysilicon material that forms the buried contact layer 38 can be offset by a metal line running on the surface of the structures. If the resistivity of the contact layer were not a problem, then only a single contact to the surface of the substrate would be required for each row of semiconductor structures 26 in the array. However, multiple contacts 58 along the length of each of the continuous buried contacts 38 could be utilized in order to reduce this resistance problem associated with the buried contact layer 38.

Referring now to FIG. 11, there is illustrated an alternate embodiment of the present invention, wherein the buried contact layer 38 is patterned and etched within the trench between rows of the multi-layered semiconductor structures 26 such that each of the multi-layered structures 26 has associated therewith a buried contact layer 66. This is the result of patterning the substrate 10 and then etching the SOG layer downward to a point beneath the buried contact layer 38, thus providing a "break" in the length of the buried contact layer 38. This is then filled with insulating layer, and then a plurality of polysilicon plugs 68 formed similar to the manner in which the polysilicon plugs 58 were formed. However, there is a polysilicon plug 68 formed for each of the buried contact layers 66, such that each of the buried contact layers 66 has a plug 68 associated therewith that extends upward to a point proximate the surface of the substrate 10 from the associated polysilicon buried contact layer 66.

Figure 12:
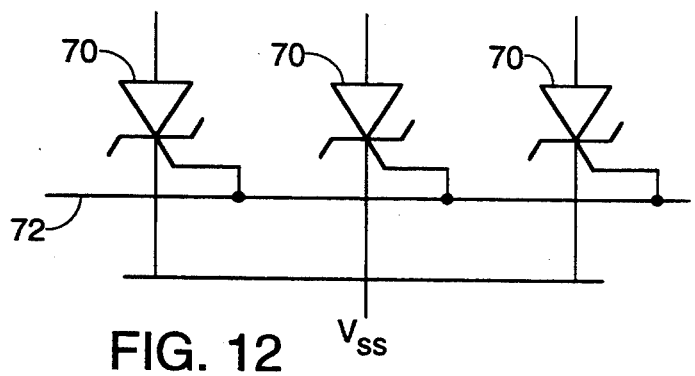
FIG. 12 illustrates a schematic diagram of the embodiment wherein four separate layers are provided of alternating conductivity types in the multi-layer semiconductor structure and a thyristor, also called Silicon Controlled Rectifier (SCR), can be formed.

Referring now to FIG. 12, there is illustrated a schematic diagram of the embodiment wherein four separate layers are provided of alternating conductivity types in the multi-layer semiconductor structure 26. This is utilized to form SCRs 70 having an anode, a cathode and a gate. The gates are connected to a gate line 72, which is formed with the continuous buried contact layer 38. The gate is provided by the semiconductor layer 14. The cathodes are connected to $V_{SS}$ and the anodes thereof providing a separate contact thereto.

Figure 13:
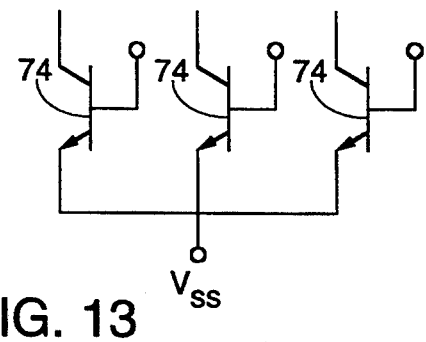
FIG. 13 illustrates an alternate embodiment wherein three alternating conductivity type layers are provided, such that a bipolar transistor can be formed.

Referring now to FIG. 13, there is illustrated an alternate embodiment wherein three alternating conductivity type layers are provided, such that a bipolar transistor 74 can be formed having an emitter, a base and a collector. The emitters are formed by the lowest layer, layer 12, and the base of the transistors 74 are formed by the next higher layer, the layer 14. This is where the buried contact layer is formed. The collectors are formed by the uppermost layer, layer 16. For this structure, the implant step for forming the layer 18 is not required. The structure of FIG. 13 assumes that the alternating layers are N-type, P-type and N-type for an N-type transistor. However, a P-type transistor could be provided wherein a P-type well or P-type substrate is utilized. This, again, is a matter of design choice.

Although the preferred embodiment has been described in detail, it should be understood that various changes, substitutions and alterations can be made therein without departing from the spirit and scope of the invention as defined by the appended claims.

What is claimed is:

1. A method for forming a semiconductor structure, comprising the steps of:
   providing a semiconductor substrate of a first conductivity type;
   implanting impurities of the first conductivity type into said substrate to a first depth to form a first layer;
   implanting impurities of a second conductivity type opposite the first conductivity type into said substrate to a second depth shallower than said first depth to form a second layer having a semiconductor junction formed between said second layer and said first layer;

implanting impurities of the first conductivity type into said substrate to a third depth shallower than said second depth to form a third layer having a semiconductor junction formed between said second and third layers;

forming a trench around at least one portion of said first, second and third layers in said semiconductor substrate to form an isolated semiconductor multi-layered structure;

forming a buried contact layer within said trench and isolated from the portion of said substrate beneath said first layer, said buried contact layer contacting the exposed portion of said second layer within said trench on said isolated semiconductor multi-layered structure; and forming a contact between said buried contact layer in said trench and a point proximate to the surface of said substrate.

2. The method of claim 1, and further comprising implanting impurities of the second conductivity type into said substrate to a fourth depth shallower than said third depth to form a fourth layer having a semiconductor junction formed between said third and fourth layers, wherein said isolated semiconductor multilayered structure is formed from said first, second, third and fourth layers.

3. The method of claim 1, wherein the step of forming said trench comprises forming a plurality of trenches arranged in rows and columns such that a plurality of isolated semiconductor multi-layered structures are formed, wherein said isolated semiconductor multi-layered structures comprises at least one of said plurality of semiconductor multi-layered structures.

4. The method of claim 3, wherein the step of forming said buried contact layer comprises forming a continuous layer of conductive material within each of said rows of said trenches disposed between rows of said semiconductor multi-layered structures, and proximate to said second layer of said semiconductor multi-layered structures on one side of said trenches and isolated from the portion of said substrate disposed beneath said first layer.

5. The method of claim 4, wherein the step of forming said trenches comprises:

patterning said substrate to define said trenches; and etching said substrate downward beyond the semiconductor junction formed between said first and second layers.

6. The method of claim 5, wherein the step of forming said buried contact layers comprises:

forming an insulator within said trenches;

etching a portion of said insulating layer formed between said trenches within the ones of said trenches aligned along said rows of said multi-layered semiconductor structures and proximate only to one side of said trenches to a depth proximate to and above said semiconductor junction between said first and second layers to form a contact trench and to expose the sides of said semiconductor multilayered structures adjacent said contact trench;

depositing a layer of polysilicon material within said contact trenches; and etching said layer of polysilicon to a depth below said semiconductor junction between said second and third layers.

7. The method of claim 6 and further comprising etching said buried contact layer in at least one position along said row to provide a break therein.

* * * * *